United States Patent
Ducros et al.

(10) Patent No.: US 6,780,927 B2
(45) Date of Patent: Aug. 24, 2004

(54) NON-SILICONE CONDUCTIVE PASTE FOR THE ELECTRICAL INDUSTRY, AND ITS USE

(75) Inventors: Jean-Alec Ducros, Fontainebleau (FR); Mohamed Aït El Cadi, La Varenne (FR)

(73) Assignee: Laird Technologies Inc., Delaware Water Gap, PA (US)

(*) Notice: Subject to any disclaimer, the term of this patent is extended or adjusted under 35 U.S.C. 154(b) by 161 days.

(21) Appl. No.: 10/010,475

(22) Filed: Nov. 8, 2001

(65) Prior Publication Data

US 2002/0051862 A1 May 2, 2002

Related U.S. Application Data

(62) Division of application No. 09/669,083, filed on Sep. 25, 2000, now Pat. No. 6,518,496.

(30) Foreign Application Priority Data

Dec. 9, 1999 (DE) .......................................... 199 59 262

(51) Int. Cl.$^7$ .............................. C08J 3/00; C08K 3/38; C08L 83/00; C08L 83/04; B32B 5/16
(52) U.S. Cl. ................ 524/588; 174/35 MS; 174/35 R; 174/35 CG; 252/62.3 T; 252/62.3 E; 361/704; 361/706; 428/323; 428/327; 428/329; 428/331; 524/401; 524/405; 524/437; 524/837; 524/860
(58) Field of Search .................................. 524/405, 401, 524/437, 439, 588, 837, 860; 174/35 MS, 35 R, 35 CG; 252/62.3 T, 62.3 E; 361/704, 706; 428/323, 327, 329, 331

(56) References Cited

U.S. PATENT DOCUMENTS

| | | | | |
|---|---|---|---|---|
| 3,653,959 A | * | 4/1972 | Kehr et al. |
| 4,775,500 A | | 10/1988 | Funakoshi et al. |
| 4,994,903 A | | 2/1991 | Wroe et al. |
| 5,275,861 A | | 1/1994 | Vaughn |
| 5,344,635 A | * | 9/1994 | Bujard et al. |
| 5,662,833 A | | 9/1997 | Laakso et al. |
| 5,955,936 A | | 9/1999 | Shaw, Jr. et al. |

FOREIGN PATENT DOCUMENTS

EP     0 103 695 A1     3/1984

* cited by examiner

Primary Examiner—Patrick D. Niland
(74) Attorney, Agent, or Firm—Pitney Hardin LLP

(57) ABSTRACT

A conductive paste based on an elastomer of the polyoxy-polyolefin type or on a member of the polyolefin family is described, provided with an admixture of conductive particles for the production, in the electronics industry, of a sealing element, of a contact element or of a heat-conduction element. This material is particularly suitable for the production of EMI-RFI gaskets, and, compared with materials known hitherto and based on silicone, has improved performance characteristics and environmental properties.

2 Claims, No Drawings

NON-SILICONE CONDUCTIVE PASTE FOR THE ELECTRICAL INDUSTRY, AND ITS USE

This application is a divisional of Ser. No. 09/669,083 filed on Sep. 25, 2000, now U.S. Pat. No. 6,518,496.

BACKGROUND OF THE INVENTION

The invention relates to a conductive paste for the electrical industry and also to its use.

Materials of this type are widely used and are needed in numerous applications. For example, the material has particular importance in connection with the sealing of electromagnetically shielded housings in electronic devices which emit electromagnetic radiation or can be disturbed by electromagnetic radiation penetrating from outside. The housings are produced from an electrically conducting material, or from a material coated so as to be electrically conducting, in order to provide EMI (electromagnetic interference) and, respectively, RFI (radio frequency interference) shielding and to improve electromagnetic compatibility (EMC). It is known that the region of the joints at which the parts of the housing are joined can also be given shielding by using gaskets made from an electrically conducting flexible material.

An example of a material of this type is known from U.S. Pat. No. 4,011,360. This known material is based on an elastomer, typically a silicone rubber material, with an admixture of electrically conducting particles. This material polymerizes when exposed to atmospheric moisture at room temperature.

DE 43 19 965 C2 discloses the use of a material of this type for the production of the housings described at the outset. The starting material is extruded as a strand of paste directly in the region of the point onto one of the parts of the housing, and polymerizes there to form the gasket. This process is also known to the skilled worker as the formed-in-place-gasket process.

Materials of this type with electrically conducting particles are moreover used for forming contact points or contact areas, known as contact pads. They thus take on the function of contact elements.

It is also possible to use thermally conductive particles in order to form what are known as thermal pads. These have the task of dissipating, for example, heat from an electronic component and of passing the same to a cooling element. One of the most important examples of the application is a microprocessor unit in which the heat generated by the processor is to be passed to a cooling carrier exposed to a fan.

Despite their undisputed useful properties, materials of this type based on silicone have some disadvantages.

In this connection a particular problem is that the silicone has the property of emitting gaseous materials with short molecular chains. These constituents condense on (adjacent) metal parts or cold sections of surfaces. The silicone oil deposit insulates the surface (mostly undesirably). For example, it has been observed that a deposit of this type considerably impairs, or destroys, the function of contact relays. Even if the contact is closed mechanically, the deposited silicone oil film can completely prevent electrical contact. Despite the recognized good properties of silicone-containing materials, they have therefore been largely eliminated by the telephone industry.

Another problem is that the silicone oil film drastically impairs the adhesion of the surface. This problem is particularly evident in the motor vehicle industry, where surfaces are frequently painted or coated. Even small amounts of a silicone deposit are sufficient to impair paint adhesion.

SUMMARY OF THE INVENTION

The object of the present invention is therefore to provide a material of the type mentioned at the outset in which the problems described have been eliminated. The material provided should be capable of unrestricted application while retaining the good properties of silicone-based materials as mentioned at the outset.

DETAILED DESCRIPTION OF THE PREFERRED EMBODIMENTS

The invention is based on the concept of using, instead of silicone, an elastomer of the polyoxypolyolefin type or a member of the polyolefin family, as in the formula:

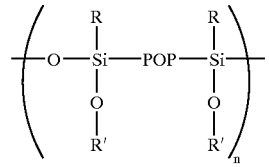

where R is alkyl, preferably methyl or ethyl, where R' is alkyl, preferably methyl or ethyl, and where POP is a polyoxyolefin, preferably polyoxypropylene.

This material has excellent mechanical properties and is particularly suitable for the formed-in-place-gasket process to make sealing elements or damping elements for housings of electronic or telecommunications devices. After polymerization, the sealing or damping elements produced in this way are soft, flexible and nontacky, but they adhere particularly well to the substrate used. They may be applied either manually or by way of computer-controlled equipment or robots.

The excellent properties of the material also mean that it can be processed by further processes known per se, such as (mold)casting, spraying, dispensing or printing.

Finally, the material has good environmental compatibility, since it is free from halogens and nontoxic. In addition, no hazardous gases of any type are produced in the event of a fire.

Since the novel material is a paste, it is firstly easy to process and can be shaped as desired by the processing methods described above. Secondly, its viscosity is such that, specifically if the formed-in-place-gasket process is used, the dimensional stability of the strand produced is sufficient for it to retain its profile without the use of any additional pressures. The polymerization can therefore take place under ambient conditions.

The admixtures of conductive particles represent filling material which permits the desired property to be achieved in the product by varying the amount, size and makeup of the particles. An important issue, besides purely mechanical properties such as the flexibility or the sealing to be achieved after polymerization, is the conductivity achievable. In this connection, different types of conductivity can be distinguished for the materials under consideration here, corresponding to the purpose for which they are intended to be used.

One of the most important applications relates to the production of gaskets on housings, or on sections of housings, printed circuit boards or the like, in order to achieve shielding with respect to high-frequency electromagnetic waves Examples of admixtures used for this are nickel powder, silver powder or gold powder or appropriate dusts. However, it is also possible to achieve the shielding effect using powders or dusts made from other materials, such as those based on aluminum, copper, nickel, iron or steel, as long as these are suitably covered or coated. Materials which can be used for the covering or coating are again nickel, silver or gold. It is also possible to use nonconducting particles, such as those based on glass, mica or plastic, as long as these are coated or covered as described above and the electrical conductivity of the particles which is required for an application of this type is achieved.

There is also substantial design freedom with regard to the shape of the particles. Besides regularly or irregularly shaped compact particles, there is particular interest in fibers which allow the strength of the polymerized and thus cured final product to be increased significantly. It is clear that, depending on the fiber material used, a suitable coating or covering must again be present.

Another important group of suitable admixtures is that of particles based on graphite, in particular nickel-graphite or ferrite, which are extremely effective in absorbing the electromagnetic waves. These are therefore used in elements which both damp or seal and have an electromagnetic action.

A final group of admixtures is used to improve thermal conductivity. The materials used for this, for example aluminum oxide ($Al_2O_3$), boron oxide or magnesium, have particularly high thermal conductivity. These, like the materials described above, are in the form of particles or filling materials when admixed with the base elastomer.

The structure of the conductive paste is usually that of what is known as a single-component material, which cures under ambient conditions at room temperature. The curing time may, if desired, be shortened by exposure to heat, in order to optimize the production process for mass production. The conductive paste may moreover also be thought of in a manner known per se as a two-component material.

In one specific example of an application it is intended that the conductive paste be used for the production of a flexible gasket for an electromagnetically shielded housing. Using a controlled-path nozzle, a paste of the material is applied directly to a part of a housing in the region in which the housing has a joint to be sealed. During discharge of the plastic material, computer-controlled handling equipment is used to move the nozzle across the part of the housing. The velocity of relative movement of nozzle and housing part is determined by the viscosity of the paste, by the amount and velocity of the material discharging from the die, by the cross-sectional area of the die passage, by the desired cross section of the gasket to be produced and by the makeup of the material.

The strand of material dispensed in this way polymerizes under ambient conditions at room temperature. This procedure takes a relatively long time, but can be accelerated by controlled exposure to heat.

The starting material used is polyoxypolyolefin with an admixture of a powder made from electrically conducting particles. The material is a single-component material and cures under ambient conditions at normal room temperature.

Another important application for these materials is in the production of contact pads, which may per se have any desired shape, for example may be an area or a dot.

A comparable method is used to produce a heat-conducting contact element, and here the paste comprises an admixture of particles with high thermal conductivity. The resultant element has a high level of thermal conductivity and prevents build-up of heat on the surface used.

What is claimed is:

1. A heat conducting pad comprising an elastomer and an admixture of thermally conductive particles, wherein the elastomer has the general formula

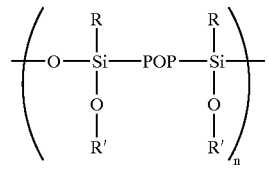

where R and R' are alkyls and POP is a polyoxyolefin.

2. A heat conducting pad comprising an elastomer and an admixture of thermally conductive particles, wherein the elastomer has the general formula

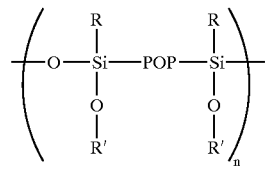

where R and R' are alkyls and POP is a polyoxyolefin, and the particles are composed of aluminum oxide, boron oxide or magnesium.

* * * * *